United States Patent
Okanobu

(10) Patent No.: US 7,212,796 B2
(45) Date of Patent: May 1, 2007

(54) ANTENNA UNIT AND RECEIVING CIRCUIT

(75) Inventor: Taiwa Okanobu, Tokyo (JP)

(73) Assignee: Sony Corporation (JP)

( * ) Notice: Subject to any disclaimer, the term of this patent is extended or adjusted under 35 U.S.C. 154(b) by 1104 days.

(21) Appl. No.: 09/921,421

(22) Filed: Aug. 2, 2001

(65) Prior Publication Data
US 2002/0047811 A1 Apr. 25, 2002

(30) Foreign Application Priority Data
Aug. 7, 2000 (JP) .......................... P2000-238161

(51) Int. Cl.
H04B 1/06 (2006.01)
H04B 1/18 (2006.01)
(52) U.S. Cl. .................................. 455/234.1; 455/280
(58) Field of Classification Search ............. 455/234.1, 455/234.2, 227, 249.1, 250.1, 251.1, 241.1, 455/280
See application file for complete search history.

(56) References Cited

U.S. PATENT DOCUMENTS

| | | | | |
|---|---|---|---|---|
| 4,592,093 A * | 5/1986 | Ouchi et al. .................... 455/4 |
| 5,734,974 A * | 3/1998 | Callaway, Jr. et al. ... 455/234.1 |
| 5,789,977 A * | 8/1998 | Willems ...................... 330/126 |
| 5,966,638 A * | 10/1999 | Mita et al. ..................... 455/5.1 |
| 6,044,253 A * | 3/2000 | Tsumura .................. 455/234.1 |
| 6,104,341 A * | 8/2000 | Mita et al. ................... 342/359 |
| 6,181,201 B1 * | 1/2001 | Black ......................... 330/129 |
| 6,218,905 B1 * | 4/2001 | Sanders ...................... 330/308 |
| 6,292,232 B1 * | 9/2001 | Oyagi ......................... 348/725 |
| 6,344,778 B1 * | 2/2002 | Nakamura et al. ............ 331/34 |

FOREIGN PATENT DOCUMENTS

| | | |
|---|---|---|
| EP | 0847135 | 6/1998 |
| JP | 05-022174 | 1/1993 |
| WO | WO0008751 | 2/2000 |

* cited by examiner

Primary Examiner—William J. Deane, Jr.
(74) Attorney, Agent, or Firm—Lerner, David, Littenberg, Krumholz & Mentlik, LLP

(57) ABSTRACT

An antenna unit includes an antenna, a high-frequency amplifier, an attenuator circuit, an output cable, and a voltage detector circuit. An operating voltage is supplied from a receiver to the high-frequency amplifier through the output cable. The operating voltage changes in accordance with an automatic gain control (AGC) voltage. The voltage detector circuit detects a change in the operating voltage. In response to the voltage detector circuit output, one of the high-frequency amplifier and the attenuator circuit is selectively connected to a signal line between the antenna and the output cable.

13 Claims, 8 Drawing Sheets

ANTENNA UNIT AND RECEIVING CIRCUIT

BACKGROUND OF THE INVENTION

1. Field of the Invention

The present invention relates to an antenna unit and a receiver.

2. Description of the Related Art

Digital audio broadcasting in the U.S. is called DARS (Digital Audio Radio Service). To realize stable reception in a receiver mounted in a vehicle, DARS uses both satellite waves and terrestrial waves.

That is, DARS uses the 2.3 GHz band. As shown in part B in FIG. 8, two services are transmitted. In this instance, each of the services uses a frequency bandwidth of 12.5 MHz. As shown in part A in FIG. 8, one service comprises two ensembles A and B. Each of the ensembles A and B provides 50 channels of programs (contents). Accordingly, one service provides 100 channels of programs.

The ensemble A is transmitted by signals A1, A2, and A3. The ensemble B is transmitted by signals B1, B2, and B3. That is, the contents of the signals A1, A2, and A3 are identical to each other. The contents of the signals B1, B2, and B3 are also identical to each other. Consequently, when any one of the signals A1, A2, and A3 can be received, the programs of the ensemble A can be received. Similarly, when any one of the signals B1, B2, and B3 can be received, the programs of the ensemble B can be received.

As shown in part A in FIG. 8, the signals A1 to A3 and the signals B1 to B3 are arranged in order of frequency, so that the signals A1, A2, and A3 and the signals B3, B2, and B1 are symmetrically arranged with respect to the central frequency $f_c$ between the signals A3 and B3.

The signals A1, A2, B1, and B2 are QPSK (Quadrature Phase Shift Keying) signals. The signals A1 and B1 are transmitted from a broadcasting satellite BS1 located over the Western U.S. and the signals A2 and B2 are transmitted from a broadcasting satellite BS2 located over the Eastern U.S. (strictly, the satellites BS1 and BS2 are positioned on the equator at a longitude corresponding to the Western and Eastern U.S.). The signals A3 and B3 are OFDM (Orthogonal Frequency Division Multiplex) signals and are transmitted from an antenna on the ground.

Therefore, since the signals A1, A2, B1, and B2 are satellite waves and a diversity effect is obtained by the satellites BS1 and BS2, the broadcasts can be received all over the U.S. In some cases, high-rise buildings block radio waves. The terrestrial-wave signals A3 and B3 compensate to the blocked waves. Consequently, in the receiver mounted in a car, even when the radio waves vary strongly due to the motion of the car, the broadcasts can still be easily received.

When the above-mentioned DARS signals are received by the receiver mounted in the car, a receiving antenna thereof has low directivity in order to obtain uniform sensitivity irrespective of the direction of travel of the car. However, the gain of a low-directivity receiving antenna is small.

Consequently, the reception levels of the signals A1, A2, B1, and B2 transmitted from the satellites BS1 and BS2 are considerably low. Actually, the reception levels of the signals A1 to B2 are higher than the noise level of the receiving antenna by 10 dB to 20 dB; that is, the levels are substantially equal to −100 dBm to 90 dBm. When the DARS signals are received, therefore, a high-frequency amplifier for amplifying the output of the receiving antenna is needed. In addition, a high-frequency amplifier with sufficiently low noise is needed.

On the other hand, the reception levels of the signals A3 and B3 transmitted from the antenna on the ground vary strongly depending on the distance from the transmitting antenna to the receiving antenna, namely, the levels are substantially equal to −90 dBm to 0 dBm. When the signals A3 and B3 are received near the transmitting antenna, the reception levels rise considerably, so that the high-frequency amplifier becomes saturated, causing large distortion.

Consequently, in consideration of the above description, a high-frequency amplifier which has a low noise level and small distortion even when the input level varies over a range of 100 dB is needed at an antenna input stage of the receiver.

Generally, when the reception level varies, AGC (Automatic Gain Control) is performed to stabilize the signal level. In case of a DARS receiver, the AGC must respond to a variable range of the reception level as high as 100 dB.

Furthermore, when the DARS receiver is mounted in the car, an antenna thereof is disposed on a portion, in which reception interference is small, for example, on the roof. Since the receiver is arranged in the car, the antenna is connected to the receiver through a cable. As mentioned above, however, the DARS broadcasts use the 2.3 GHz band, so attenuation caused by the cable is large. Generally, attenuation of about 10 dB is caused. Accordingly, when the antenna is simply connected to the receiver through the cable, it is difficult to receive the satellite-wave signals A1 to B2.

Generally, in such a case, a high-frequency amplifier is integrated with the antenna, a received signal of the antenna is amplified by the high-frequency amplifier, and the resultant signal is supplied to the receiver through the cable. In this instance, the necessary operating voltage for the high-frequency amplifier is supplied from the receiver through the cable.

However, to perform AGC in the high-frequency amplifier integrated with the antenna, an AGC voltage is generated from the receiver, thus necessitating a line for supplying the AGC voltage to the high-frequency amplifier. Consequently, a special cable or connector is needed.

To perform AGC in the high-frequency amplifier, the high-frequency amplifier should comprise a variable gain amplifier. The NF (Noise Figure) of the variable gain amplifier is generally lower than that of a fixed gain amplifier. Accordingly, the variable gain amplifier cannot be used as a high-frequency amplifier in which low noise is required.

The present invention intends to solve the above problems.

SUMMARY OF THE INVENTION

Accordingly, it is an object of the present invention to provide an antenna unit including a high-frequency amplifier for amplifying a reception signal received by an antenna, wherein an output signal of the high-frequency amplifier is supplied to a receiver through a regular output cable such as a coaxial cable, an operating voltage is supplied from the receiver to the high-frequency amplifier through the output cable, and a signal to control the gain is supplied from the receiver through the output cable.

Particularly, an antenna unit includes: a high-frequency amplifier for amplifying a reception signal received by an antenna; an attenuator circuit; and a switching circuit, wherein, an operating voltage is supplied from a receiver, to which an output signal of the high-frequency amplifier is supplied through an output cable, to the high-frequency amplifier through the output cable; a control signal is supplied from the receiver to the switching circuit through the output cable; and the switching circuit is controlled in accordance with the control signal to selectively connect one of the high-frequency amplifier and the attenuator circuit to a signal line between the antenna and the output cable.

Another object of the present invention is to provide a receiver using an antenna unit that has a high-frequency amplifier, outputs a signal received by an antenna with a predetermined gain through a regular output cable such as a coaxial cable, and is capable of changing the gain. The receiver includes: a voltage source of an operating voltage for the high-frequency amplifier; and a control circuit for controlling the magnitude of the operating voltage, wherein, the operating voltage from the voltage source is supplied to the high-frequency amplifier of the antenna unit through the output cable; and the control circuit controls the magnitude of the operating voltage to change the gain.

Particularly, a receiver uses an antenna unit which transmits a signal received by an antenna with a predetermined gain to an output cable and which is capable of changing the gain in accordance with a first control signal. The receiver includes: a connector which is connected to the output cable; a receiving circuit having at least a high-frequency amplifier, a variable attenuator circuit, and a switching circuit; and a generator circuit for generating the first control signal and second and third control signals from an AGC voltage corresponding to the output level of the receiving circuit, wherein, an operating voltage is supplied to the antenna unit through the output cable; the first control signal generated from the generator circuit is supplied to the antenna unit through the output cable to change the gain; the switching circuit is controlled in accordance with the second control signal to selectively connect one of the high-frequency amplifier and the variable attenuator circuit to a signal line between the connector and a circuit in the subsequent stage; and the third control signal controls the gain of the variable attenuator circuit.

Consequently, the high-amplifier, attenuator circuit, and variable attenuator circuit are controlled according to a received signal strength, so that AGC with a wide dynamic range is performed.

DESCRIPTION OF THE PREFERRED EMBODIMENTS

Figure 1:
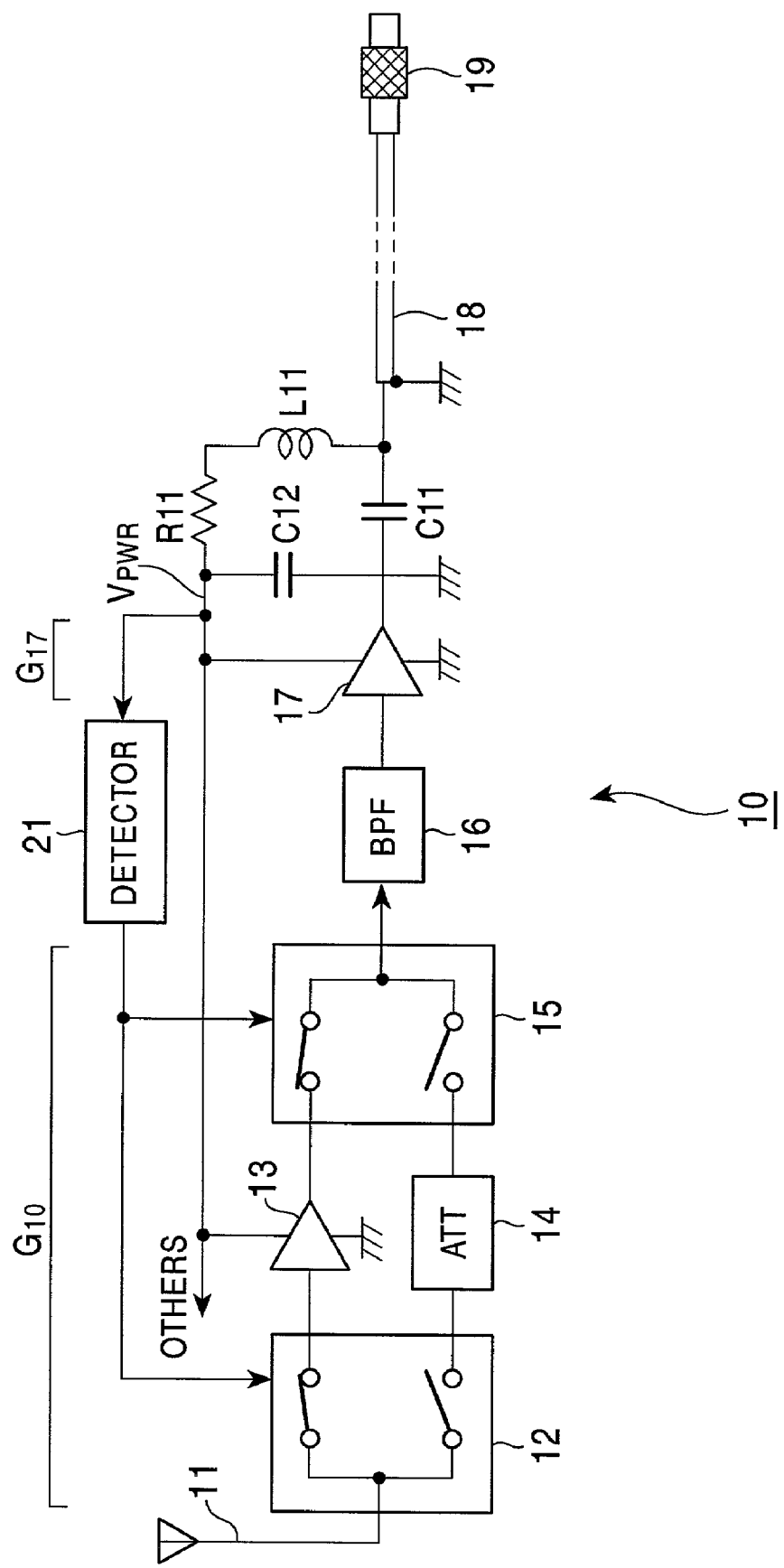
FIG. 1 is a block diagram showing an embodiment of the present invention.
Figure 2:
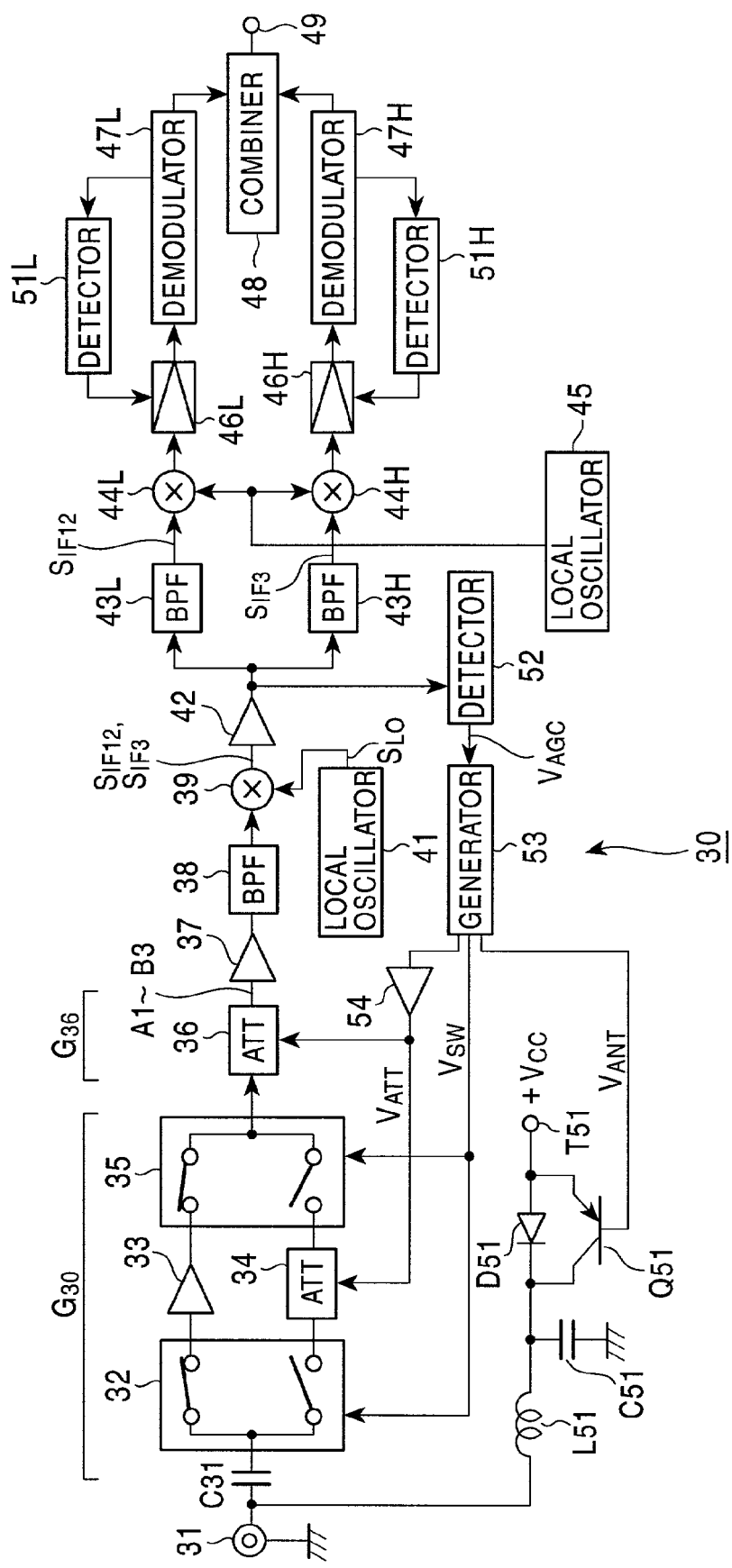
FIG. 2 is a block diagram showing another embodiment of the invention.

FIGS. 1 and 2 show an example of a case where the present invention is applied to an antenna unit and a receiver for receiving DARS signals. Reference numeral 10 denotes an antenna unit and reference numeral 30 indicates a receiver.

In the antenna unit 10, a receiving antenna 11 for the DARS signals A1 to B3 is connected to a high-frequency amplifier 13 or an attenuator circuit 14 via a switching circuit 12. In this case, to selectively connect the antenna 11 to one of the high-frequency amplifier 13 and the attenuator circuit 14, the switching circuit 12 has a switching element such as a gallium arsenide FET (field effect transistor), in which the loss or noise is low when turned on, which exhibits excellent isolation when turned off, and which has excellent high-frequency characteristics. The switching circuit 12 is represented as a single-pole double-throw switch in FIG. 1.

The high-frequency amplifier 13 comprises a low-noise amplifier. A gain $G_{13}$ thereof is fixed at, for example, $G_{13}$=14 dB. Moreover, a gain $G_{14}$ of the attenuator circuit 14 is fixed at, for example, $G_{14}$=−6 dB. In the following description, the gain is expressed in decibels (dB).

Figure 8:
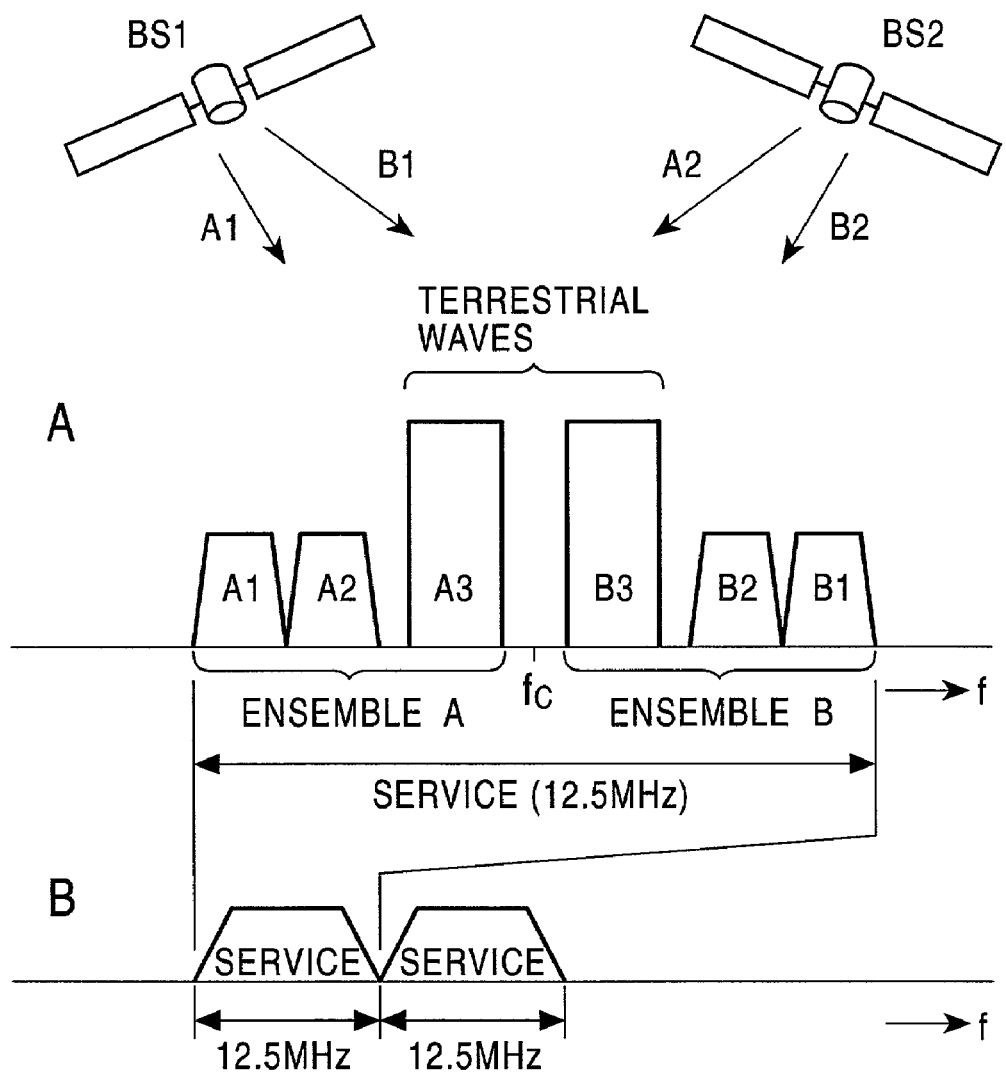
FIG. 8 is a frequency spectrum diagram for explaining DARS.

Either the high-frequency amplifier 13 or the attenuator circuit 14 is connected to a band-pass filter 16 through a switching circuit 15. In this case, the switching circuit 15 is constructed in a manner similar to the switching circuit 12 and selectively connects either the high-frequency amplifier 13 or the attenuator circuit 14 to a high-frequency signal line. The band-pass filter 16 comprises, e.g., an SAW (Surface Acoustic Wave) filter and has characteristics for allowing the two services shown in part B in FIG. 8 to pass through.

Further, an output terminal of the band-pass filter 16 is connected to an input terminal of a high-frequency amplifier 17 comprising a fixed-gain low-noise amplifier. An output terminal on the hot side of the amplifier 17 is connected to the conductor (hot-side line) of a coaxial cable 18 via a capacitor C11 for DC blocking. In this case, the coaxial cable 18 is a regular cable. The cable supplies the signals A1 to B3 received by the antenna unit 10 to the receiver 30 and also supplies an operating voltage for the antenna unit 10 and a control voltage for the gain of the antenna unit 10 from the receiver 30 to the antenna unit 10. The cable is connected to a connector plug 19 at the right in FIG. 1.

The connection point between the capacitor C11 and the conductor of the cable 18 is connected to a power supply line on the hot side of the amplifiers 13 and 17 through a high-frequency choke coil L11 and a resistor R11. A capacitor C12 is connected between the power supply line on the hot side and the ground. Consequently, when the operating voltage for the antenna unit 10 is supplied from the receiver 30 via the coaxial cable 18, a DC voltage $V_{PWR}$ occurs at the connection point between the elements R11 and C12. The voltage $V_{PWR}$ is supplied to the amplifiers 13 and 17 as an operating voltage thereof. As will be explained below, the voltage $V_{PWR}$ is a voltage that changes to a voltage $V_H$ or a voltage $V_L$. For example, $V_H$ is equal to 3 V and $V_L$ is equal to 2.7 V.

Furthermore, the voltage $V_{PWR}$ is supplied to a voltage detector circuit 21 to detect whether $V_{PWR}$=$V_L$ or $V_{PWR}$=$V_H$. A detection output of the detector circuit 21 is supplied to the switching circuits 12 and 15 as a control voltage thereof. When $V_{PWR}$=$V_L$, as shown in FIG. 1, the switching circuits 12 and 15 are connected to the amplifier 13. When $V_{PWR}$=$V_H$, contrary to the situation shown in FIG. 1, they are connected to the attenuator circuit 14.

The whole antenna unit 10 is held in one enclosure (not shown). The coaxial cable 18 extends from the enclosure.

Accordingly, the antenna unit 10 is disposed on, for example, the roof of a car and the cable 18 is introduced into the car.

As shown in FIG. 2, in the receiver 30, the hot side of a connector jack 31, to which the connector plug 19 of the antenna unit 10 is connected, is connected to one of a high-frequency amplifier 33 and a variable attenuator circuit 34 through a capacitor C31 and a switching circuit 32. In this case, the switching circuit 32 is constructed in a manner similar to the switching circuit 12. The connector jack 31 is selectively connected to one of the high-frequency amplifier 33 and the variable attenuator circuit 34.

The high-frequency amplifier 33 comprises a low-noise amplifier. A gain $G_{33}$ thereof is fixed. A control voltage $V_{ATT}$ changes a gain $G_{34}$ of the variable attenuator circuit 34.

One of the high-frequency amplifier 33 and the attenuator circuit 34 is connected to a variable attenuator circuit 36 via a switching circuit 35. The switching circuit 35 is also constructed in a manner similar to the switching circuit 12. The switching circuit 35 selectively connects one of the high-frequency amplifier 33 and the variable attenuator circuit 34 to a high-frequency signal line. The control voltage $V_{ATT}$ varies a gain $G_{36}$ of the variable attenuator circuit 36.

As will be explained below, the received signals A1 to A3 and B1 to B3, subjected to AGC, are generated from the variable attenuator circuit 36. In the following description, for the sake of simplicity, as shown in FIG. 6A, the signals A1 and A2 are combined into a signal A12 and the signals B1 and B2 are combined into a signal B12.

That is, the signals A12, A3, B12, and B3 (signals A1 to B3) generated from the variable attenuator circuit 36 are supplied to a first mixer circuit 39 through a high-frequency amplifier 37, comprising a low-noise amplifier, and a band-pass filter 38. A first local oscillation signal $S_{LO}$ is also supplied from a first local oscillator circuit 41 to the first mixer circuit 39. The signals A12 to B3 are frequency-converted into first intermediate-frequency signals. The band-pass filter 38 comprises, for example, an SAW filter and has characteristics for allowing the two services shown in part B in FIG. 8 to pass through.

Figure 6A:
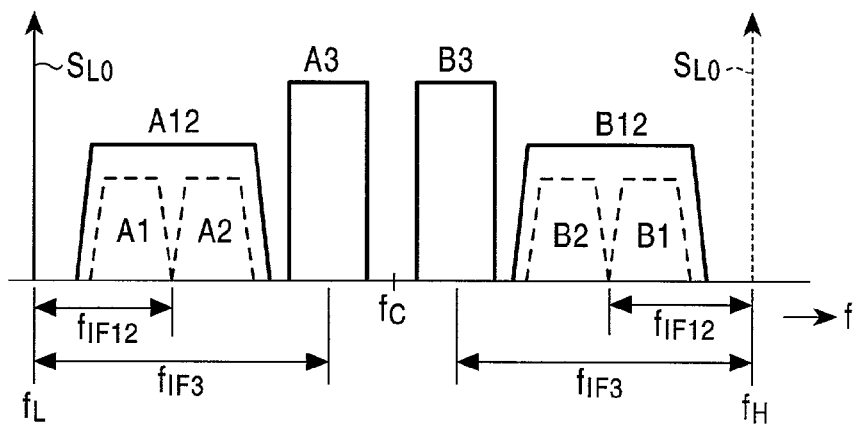
FIGS. 6A to 6C are frequency spectrum diagrams for explaining the invention.
Figure 6B:
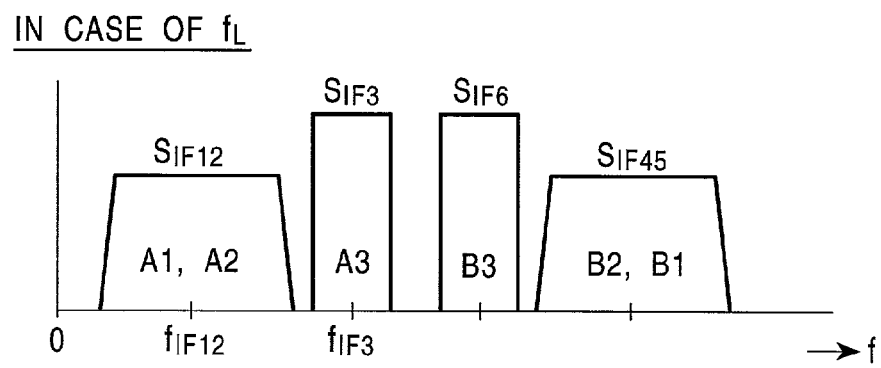

When the ensemble A is received (the signals A1 to A3 are needed), as shown by a solid line in FIG. 6A, the frequency of the first local oscillation signal $S_{LO}$ is set to a predetermined frequency $f_L$ that is lower than those of the signals A12 and A3. Accordingly, as shown in FIG. 6B, the signal A12 is frequency-converted into a first intermediate-frequency signal $S_{IF12}$ (intermediate frequency $f_{IFL12}$), the signal A3 is frequency-converted into a first intermediate-frequency signal $S_{IF3}$ (intermediate frequency $f_{IF3}$), the signal B12 is frequency-converted into a first intermediate-frequency signal $S_{IF45}$, and the signal B3 is frequency-converted into a first intermediate-frequency signal $S_{IF6}$.

Figure 6C:
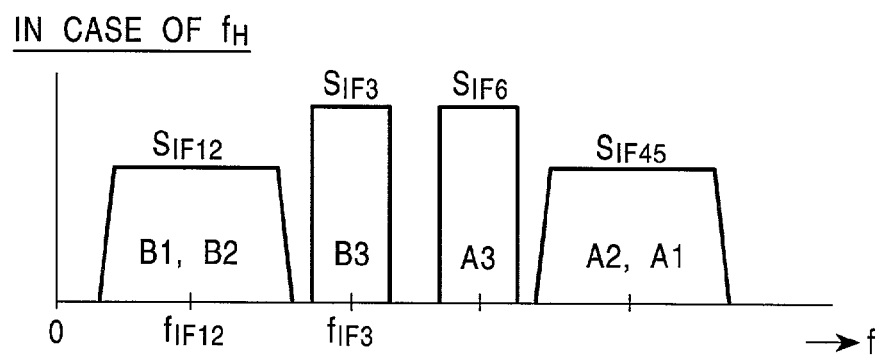

In consideration of image characteristics, the first intermediate-frequencies $f_{IF12}$ and $f_{IF3}$ cannot be lowered much. Since a frequency band of 2.3 GHz is used for broadcasting, the first intermediate frequencies $f_{IF12}$ and $f_{IF3}$ are set to 100 MHz or higher. For example, $f_{IF12} \approx 113$ MHz, $f_{IF3} \approx 116$ MHz When the ensemble B is received (the signals B1 to B3 are needed), as shown by a broken line in FIG. 6A, the frequency of the first local oscillation signal $S_{LO}$ is set to a predetermined frequency $f_H$ that is higher than those of the signals B12 and B3. Accordingly, as shown in FIG. 6C, the signal B12 is frequency-converted into the first intermediate-frequency signal $S_{IF12}$ (intermediate frequency $f_{IF12}$), the signal B3 is frequency-converted into the first intermediate-frequency signal $S_{IF3}$ (intermediate frequency $f_{IF3}$), and the signals A12 and A3 are frequency-converted into the first intermediate-frequency signals $S_{IF45}$ and $S_{IF6}$, respectively.

In both the case where the ensemble A is received and the case where the ensemble B is received, the intermediate-frequency signals $S_{IF12}$ to $S_{IF6}$ are supplied to a band-pass filter 43L, serving as a first intermediate-frequency filter, through an intermediate-frequency amplifier 42, so that the intermediate-frequency signal $S_{IF12}$ is generated. The signal $S_{IF12}$ is supplied to a second mixer circuit 44L. A second local oscillation signal having a predetermined frequency is generated from a second local oscillator circuit 45. The signal is also supplied to the second mixer circuit 44L, so that the signal $S_{IF12}$ is frequency-converted into a second intermediate-frequency signal. The signal is supplied to a demodulator circuit 47L through a variable gain amplifier 46L for AGC to demodulate a digital audio signal for a target program. The signal is then supplied to a combiner circuit 48.

The signals $S_{IF12}$ to $S_{IF6}$ from the mixer circuit 39 are supplied to a band-pass filter 43H, acting as a first intermediate-frequency filter, to generate the intermediate-frequency signal $S_{IF3}$. The signal $S_{IF3}$ is supplied to a second mixer circuit 44H. The second local oscillation signal from the second local oscillator circuit 45 is supplied to the mixer circuit 44H, so that the signal $S_{IF3}$ is frequency-converted into a second intermediate-frequency signal. The signal is supplied to a demodulator circuit 47H through a variable gain amplifier 46H for AGC to demodulate a digital audio signal of a target program. The signal is then supplied to the combiner circuit 48.

In the combiner circuit 48, either the signal from the demodulator circuit 47L or the signal from the demodulator circuit 47H is selected or both the signals are combined, and the resultant signal is generated at an output terminal 49.

At that time, a part of the second intermediate-frequency signal is supplied from the demodulator circuit 47L to a level detector circuit 51L to generate an AGC voltage. The AGC voltage is supplied as a gain control signal to the amplifier 46L, so that the second intermediate-frequency signal of the signal A12 or B12 is subjected to AGC. Further, a part of the second intermediate-frequency signal is supplied from the demodulator circuit 47H to a level detector circuit 51H to generate an AGC voltage. The AGC voltage is supplied as a gain control signal to the amplifier 46H, so that the second intermediate-frequency signal of the signal A3 or B3 is subjected to AGC.

Consequently, the frequency of the first local oscillation signal $S_{LO}$ is changed into one of the frequencies $f_L$ and $f_H$, so that the digital signal of the ensemble A or that of the ensemble B is outputted at the terminal 49.

At that time, when the ensemble A is received, one of the digital signal demodulated from the received signal A12 and the digital signal demodulated from the received signal A3 is selected or both the signals are combined, and the resultant signal is outputted at the terminal 49. Consequently, the digital signal having few errors can be obtained irrespective of the receiving conditions. For the same reason, when the ensemble B is received, the digital signal having few errors can be obtained irrespective of the receiving conditions.

To perform AGC on the signals A1 to B3 in high-frequency stages of the antenna unit 10 and the receiver 30, according to the invention, the antenna unit 10 and the receiver 30 are constructed as follows. That is, as mentioned above, the antenna unit 10 is provided with the circuits 12 to 15 including the switching circuits 12 and 15 and the voltage detector circuit 21 in the high-frequency stage, and the receiver 30 includes the circuits 32 to 36 in the high-frequency stage.

In this case, the gain $G_{34}$ of the variable attenuator circuit 34 and the gain $G_{36}$ of the variable attenuator circuit 36 change logarithmically with respect to the control voltage $V_{ATT}$. That is, decibel values of the gains $G_{34}$ and $G_{36}$ change linearly.

A part of the first intermediate-frequency signals $S_{IF12}$ and $S_{IF3}$ outputted from the intermediate-frequency amplifier 42 is supplied to a level detector circuit 52, thereby generating an AGC voltage $V_{AGC}$ whose level increases when the levels of the received signals A1 to B3 increase. The AGC voltage $V_{AGC}$ is supplied to a control voltage generator circuit 53, thereby generating control voltages $V_{ANT}$, $V_{SW}$, and $V_{ATT}$, which change with respect to the AGC voltage $V_{AGC}$ as shown in, for example, graphs A to C in FIG. 3.

In other words, for the sake of simplicity, it is assumed that a minimum value of each of the voltages $V_{AGC}$ and $V_{ATT}$ is equal to 0. It is also assumed that two predetermined values in the AGC voltage $V_{AGC}$ are set to values $V_1$ and $V_2$ ($V_1 < V_2$).

When $V_{AGC} < V_2$, the control voltage $V_{ANT}$ becomes high ("H"). When $V_{AGC} \geq V_2$, the voltage $V_{ANT}$ becomes low ("L"). When $V_{AGC} < V_1$, the control voltage $V_{SW}$ becomes high ("H"). When $V_{AGC} \geq V_1$, the voltage $V_{SW}$ becomes low ("L").

As the AGC voltage $V_{AGC}$ increases from the minimum value of 0 V, the control voltage $V_{ATT}$ increases from the minimum value of 0 V. When $V_{AGC} = V_1$, the voltage temporarily decreases to the minimum value of 0 V. After that, as the AGC voltage $V_{AGC}$ increases, the voltage increases from the minimum value of 0 V. When $V_{AGC} = V_2$, the control voltage $V_{ATT}$ decreases by a predetermined value $\Delta V$. After that, as the AGC voltage $V_{AGC}$ increases, the voltage increases again. At that time, the rate of change of the voltage $V_{ATT}$ in the case where $V_1 < V_{AGC}$ is ½ that of the voltage $V_{ATT}$ in the case where $0 \leq V_{AGC} < V_1$.

The control voltage $V_{ATT}$ is supplied as a control signal for the gains $G_{34}$ and $G_{36}$ to the variable attenuator circuits 34 and 36. As the voltage $V_{ATT}$ becomes larger, the gains $G_{34}$ and $G_{36}$ are set smaller (each attenuation is larger). When $V_{ATT} = 0$ V (minimum value), each of the gains $G_{34}$ and $G_{36}$ of the variable attenuator circuits 34 and 36, namely, the maximum gain thereof (minimum attenuation) is set to a value $G_0$. Generally, although the value $G_0$ approximates to 0 dB, it has a negative value.

The control voltage $V_{SW}$ is supplied to the switching circuits 32 and 35 as a switching control signal thereof. When $V_{SW}$ is high ("H"), the switching circuits 32 and 35 are connected to the amplifier 33. When $V_{SW}$ is low ("L"), they are connected to the attenuator circuit 34.

Furthermore, the control voltage $V_{ANT}$ is supplied to a base of a transistor Q51. A power supply terminal T51 is connected to the hot side of the connector jack 31 through a diode D51 and a high-frequency choke coil L51. An emitter and a collector of the transistor Q51 are connected in parallel to the diode D51. A capacitor C51 is connected between the connection point of the elements D51 and L51 and the ground.

In such a configuration, a voltage $+V_{CC}$ of the terminal T51 is generated as the voltage $V_{PWR}$ through the following path: the diode D51 or transistor Q51→coil L51→jack 31→plug 19→coaxial cable 18→coil L11→resistor R11.

Since the voltage $V_{PWR}$ is supplied to the amplifiers 13 and 17 as an operating voltage thereof, the antenna unit 10 becomes active.

In this case, when it is assumed that:
$VD_{51}$: voltage drop of the diode D51, and
$V_{QEC51}$: voltage drop between the emitter and the collector of the transistor Q51 then, generally:

$$V_{D51} > V_{QEC51}.$$

Consequently, when the transistor Q51 is turned off:

$$V_{PWR} = V_{CC} - V_{D51} - V_{R11}$$

where $V_{R11}$ is the voltage drop of the resistor R11.

When the transistor Q51 is turned on:

$$V_{PWR} = V_{CC} - V_{QEC51} - V_{R11}$$

The power supply voltage $+V_{CC}$ and the type (standard) of the diode D51 are preliminarily selected. For example, in the case where a Schottky diode is used as the diode D51, when the transistor Q51 is turned off:

$$V_{PWR} = V_{CC} - V_{D51} - V_{R11} = V_L$$

When the transistor Q51 is turned on:

$$V_{PWR} = V_{CC} - V_{QEC51} - V_{R11} = V_H$$

When the antenna unit 10 is in the operating state, the signals A1 to B3 received by the antenna 11 are supplied to the amplifier 37 through the following signal path: the antenna 11→switching circuit 12→amplifier 13 or attenuator circuit 14→switching circuit 15→band-pass filter 16→amplifier 17→capacitor C11→coaxial cable 18→plug 19→jack 31→capacitor C31→switching circuit 32→amplifier 33 or attenuator circuit 34→switching circuit 35→attenuator circuit 36. Consequently, as mentioned above, the DARS program can be received.

In this case, as shown in FIGS. 1 and 2, it is assumed that:
$G_{10}$: gain of the portion from the switching circuit 12 to the switching circuit 15,
$G_{17}$: gain of the amplifier 17,
$G_{30}$: gain of a range from the switching circuit 32 to the switching circuit 35, and
$G_{36}$: gain of the attenuator circuit 36, then a total gain $G_{ALL}$ of the portion from the output terminal of the antenna 11 to the input terminal of the amplifier 37 is:

$$G_{ALL} = G_{10} + G_{17} + G_{30} + G_{36} + \text{other losses} \quad (A)$$

Accordingly, the relationships between the gains $G_{10}$, $G_{17}$, $G_{30}$, and $G_{36}$ and the AGC voltage $V_{AGC}$ are as follows.

[1] Gain $G_{10}$

The switching circuits 12 and 15 are controlled by a detection output of the detector circuit 21, so that the gain $G_{10}$ changes as described below.

(1) When $0 \leq V_{AGC} < V_1$

Figure 3:
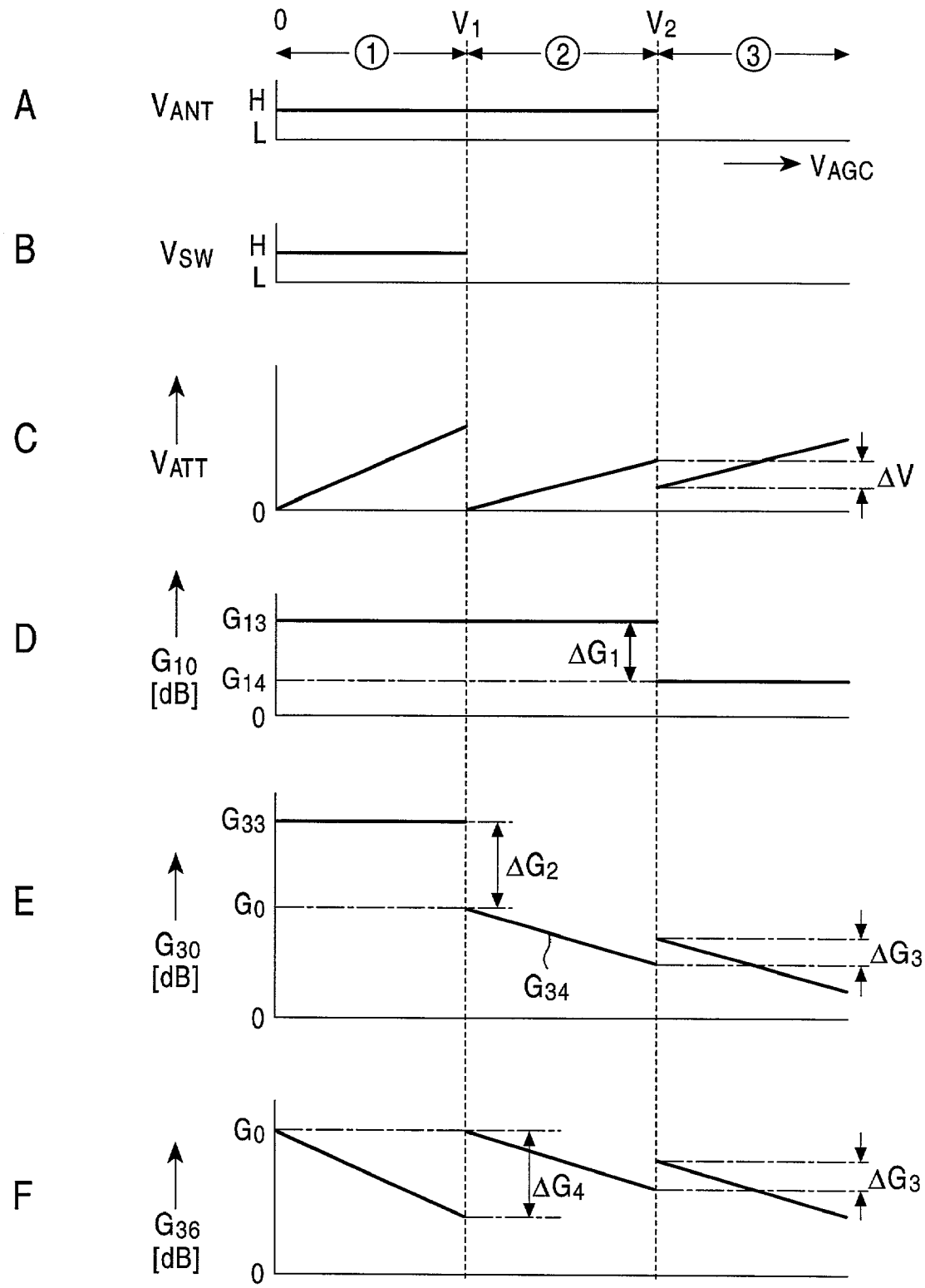
FIG. 3 includes characteristic graphs A to F for explaining the invention.

As shown in graph A in FIG. 3, since $V_{ANT}$ is high ("H"), the transistor Q51 is turned off. In the antenna unit 10, $V_{PWR} = V_L$. The detector circuit 21 detects the fact that $V_{PWR} = V_L$. Due to the detection output thereof, the switching circuits 12 and 15 are connected to the amplifier 13, as shown in FIG. 1. As shown in graph D in FIG. 3, therefore, the gain $G_{10}$ is equivalent to the gain $G_{13}$ of the amplifier 13 in the antenna unit 10.

(2) When $V_1 \leq V_{AGC} < V_2$

As shown in graph A in FIG. 3, in this case as well, $V_{ANT}$ is high ("H"). Accordingly, as shown in graph D in FIG. 3, the gain $G_{10}$ is equivalent to the gain $G_{13}$ of the amplifier 13, as in case (1).

(3) When $V_2 \leq V_{AGC}$

As shown in graph A in FIG. 3, since $V_{ANT}$ is low ("L"), the transistor Q51 is turned on, so that $V_{PWR} = V_H$. The detector circuit 21 detects the fact that $V_{PWR} = V_H$. Due to the detection output thereof, the switching circuits 12 and 15 are connected to the attenuator circuit 14, contrary to the situation shown in FIG. 1. As shown in graph D in FIG. 3, therefore, the gain $G_{10}$ is equivalent to the gain $G_{14}$ of the attenuator circuit 14.

When the voltage changes from case (2) to case (3), the gain $G_{10}$ decreases from the present gain $G_{13}$ to the gain $G_{14}$. The gain difference $(G_{13} - G_{14})$ is set as a value $\Delta G_1$.

[2] Gain $G_{17}$

Since the gain $G_{17}$ is the gain of the amplifier 17, it is constant irrespective of the value of the AGC voltage $V_{AGC}$.

[3] Gain $G_{36}$

Before describing the gain $G_{30}$, the gain $G_{36}$ will be described here. The control voltage $V_{ATT}$ controls the gain $G_{36}$ as follows.

(1) When $0 \leq V_{AGC} < V_1$

As shown in graph C in FIG. 3, the control voltage $V_{ATT}$ monotonically increases from the minimum value of 0 V in response to an increase of the AGC voltage $V_{AGC}$. Accordingly, as shown in graph F in FIG. 3, the gain $G_{36}$ monotonically decreases from a maximum value $G_0$ in response to the increase of the AGC voltage $V_{AGC}$.

(2) When $V_1 \leq V_{AGC} < V_2$

In this case as well, as shown in graph C in FIG. 3, the control voltage $V_{ATT}$ monotonically increases from the minimum value of 0 V in response to the increase of the AGC voltage $V_{AGC}$. Consequently, as shown in graph F in FIG. 3, the gain $G_{36}$ monotonically decreases from the maximum value $G_0$ in response to the increase of the AGC voltage $V_{AGC}$.

Since the rate of decrease of the control voltage $V_{ATT}$ in case (2) is ½ that in case (1), the rate of decrease of the gain $G_{36}$ in case (2) is also ½ that in case (1). When the voltage changes from case (1) to case (2), the gain $G_{36}$ increases from the present gain to the gain $G_0$. The gain difference in this case is set as a value $\Delta G_4$.

(3) When $V_2 \leq V_{AGC}$

As shown in graph C in FIG. 3, when the voltage changes from case (2) to case (3), the control voltage $V_{ATT}$ decreases from the present voltage by a value $\Delta V$. After that, the voltage monotonically increases in response to the increase of the AGC voltage $V_{AGC}$.

As shown in graph F in FIG. 3, therefore, when the voltage changes from case (2) to case (3), the gain $G_{36}$ increases from the present gain value by a value $\Delta G_3$ corresponding to the voltage drop $\Delta V$. After that, the voltage monotonically decreases in response to the increase of the AGC voltage $V_{AGC}$.

Since the rate of decrease of the control voltage $V_{ATT}$ in case (3) is ½ that in case (1), the rate of decrease of the gain $G_{36}$ in case (3) is also ½ that in case (1).

[4] Gain $G_{30}$

The switching circuits 32 and 35 are controlled by the control voltage $V_{SW}$ and the attenuator circuit 34 is controlled by the control voltage $V_{ATT}$, so that the gain $G_{30}$ is changed as follows.

(1) When $0 \leq V_{AGC} < V_1$

As shown in graph B in FIG. 3, since $V_{SW}$ is high ("H"), the switching circuits 32 and 35 are connected to the amplifier 33 as shown in FIG. 2. AS shown in graph E in FIG. 3, therefore, the gain $G_{30}$ is equivalent to the gain $G_{33}$ of the amplifier 33.

(2) When $V_1 \leq V_{AGC} < V_2$

As shown in graph B in FIG. 3, since $V_{SW}$ is low ("L"), the switching circuits 32 and 35 are connected to the attenuator circuit 34, contrary to the case shown in FIG. 2. Consequently, the gain $G_{30}$ is equivalent to the gain $G_{34}$ of the attenuator circuit 34.

In this case, since the attenuator circuit 34 is controlled by the control voltage $V_{ATT}$ as in the same way as the attenuator circuit 36, the gain $G_{34}$ changes in the same way as the gain $G_{36}$. When the voltage changes from case (1) to case (2), the gain $G_{36}$ decreases from the present gain $G_{33}$ to the gain $G_0$. Such a gain difference $(G_{33} - G_0)$ is set as a value $\Delta G_2$.

(3) When $V_2 \leq V_{AGC}$

As shown in graph B in FIG. 3, in this case as well, $V_{SW}$ is low ("L"). Accordingly, the switching circuits 32 and 35 are connected to the attenuator circuit 34, contrary to the case shown in FIG. 2. Consequently, the gain $G_{30}$ is equivalent to the gain $G_{34}$ of the attenuator circuit 34. In this case as well, since the attenuator circuit 34 is controlled by the control voltage $V_{ATT}$ as in the same way as the attenuator circuit 36, the gain $G_{34}$ changes in a manner similar to the gain $G_{36}$.

[5] Total gain $G_{ALL}$

Since the total gain $G_{ALL}$ is shown by equation (A) above, it has a characteristic obtained by combining characteristics shown in graphs D to F in FIG. 3. The gains or characteristics of the respective circuits are initially set to the following values:

$$\Delta G_1 = 2 \cdot \Delta G_3, \text{and}$$

$$\Delta G_2 = \Delta G_4.$$

Figure 4:
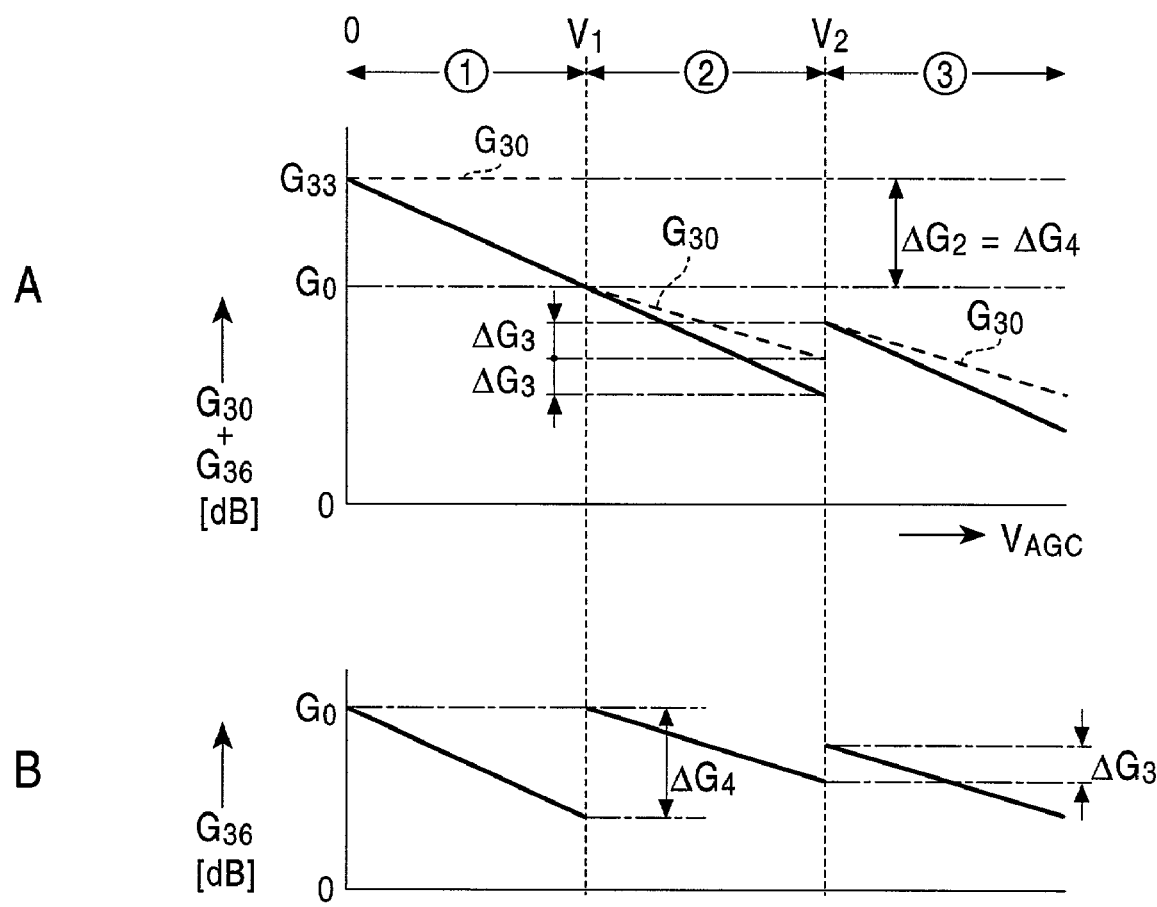
FIG. 4 shows characteristic graphs A and B for explaining the invention.

In equation (A), consideration is made with respect to a combined gain $(G_{30} + G_{36})$ of the gains $G_{30}$ and $G_{36}$ with reference to FIG. 4. The characteristic indicated by the broken lines in graph A in FIG. 4 is the same as that in graph E in FIG. 3, namely, the characteristic of the gain $G_{30}$. The characteristic of graph B in FIG. 4 is the same as that of graph F in FIG. 3, namely, the characteristic of the gain $G_{36}$. Moreover, for the sake of simplicity, it is assumed that $G_0 = 0$ dB.

When the characteristic of the gain $G_{36}$ is shown as a graph on the basis of the characteristic of the gain $G_{30}$ as a reference, the characteristic indicated by solid lines is obtained. It indicates the characteristic of the gain $(G_{30} + G_{36})$. That is, when the AGC voltage $V_{AGC}$ changes from case (1) to case (2), the gain $G_{30}$ decreases from the gain $G_{33}$ by the gain $\Delta G_2$. At that time, the gain $G_{36}$ increases by the gain $\Delta G_4$ and $\Delta G_2 = \Delta G_4$. Accordingly, when the AGC voltage $V_{AGC}$ changes from case (1) to case (2), there is no step in the characteristic of the gain $(G_{30} + G_{36})$.

Since the rate of decrease of each of the gains $G_{30}$ and $G_{36}$ in case (2) is ½ that of the gain $G_{36}$ in case (1), the rate of decrease of the gain $(G_{30} + G_{36})$ in case (2) is equivalent to that of the gain $G_{36}$ in case (1).

Consequently, the characteristic of the gain $(G_{30} + G_{36})$ in cases (1) and (2) continuously decreases at a fixed rate, as shown by one solid line in graph A in FIG. 4.

When the AGC voltage $V_{AGC}$ changes from case (2) to case (3), the gains $G_{30}$ and $G_{36}$ both increase by the gain $\Delta G_3$. Accordingly, when the AGC voltage $V_{AGC}$ changes from case (2) to case (3), the gain ($G_{30}+G_{36}$) increases by the gain $2\cdot\Delta G_3$.

Furthermore, since the rate of decrease of each of the gains $G_{30}$ and $G_{36}$ in case (3) is ½ that of the gain $G_{36}$ in case (1), the rate of decrease of the gain ($G_{30}+G_{36}$) in case (3) is equivalent to that of the gain $G_{36}$ in case (1).

Figure 5:
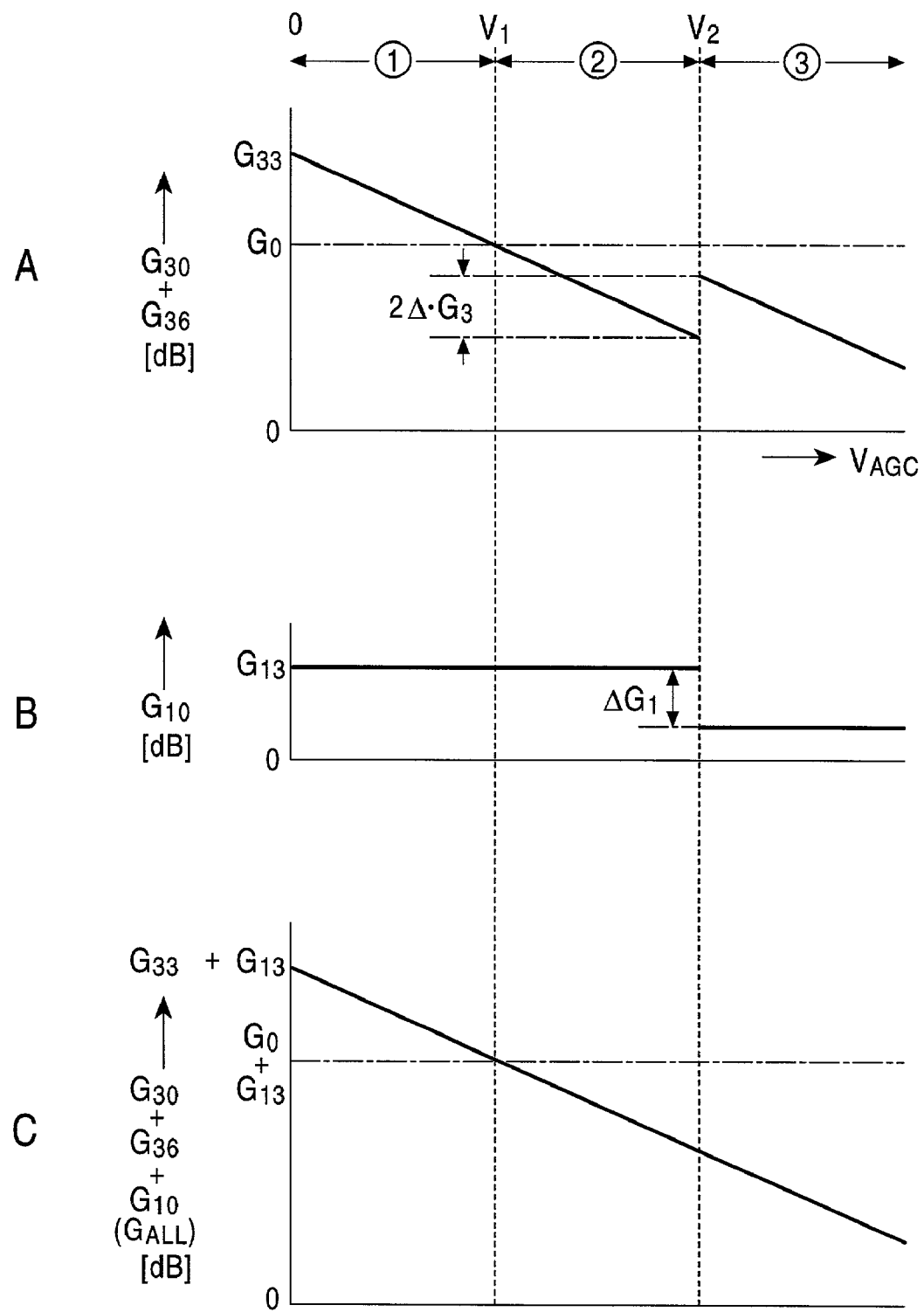
FIG. 5 includes characteristic graphs A to C for explaining the invention.

Accordingly, as shown by the solid lines in graph A in FIG. 5, when the AGC voltage $V_{AGC}$ changes from case (2) to case (3), the characteristic of the gain ($G_{30}+G_{36}$) in case (3) increases by the gain $2\cdot\Delta G_3$ and is in parallel with that in case (2).

In equation (A), since the gains ($G_{30}+G_{36}$) and $G_{10}$ are further combined, a combined gain ($G_{30}+G_{36}+G_{10}$) is indicated by the characteristic shown in graph C in FIG. 5. That is, the characteristic in graph A in FIG. 5 is the same as that shown by the solid lines in graph A in FIG. 4, and indicates the characteristic of the gain ($G_{30}+G_{36}$). The characteristic in graph B in FIG. 5 is the same as that in graph D in FIG. 3, and indicates the characteristic of the gain $G_{10}$.

Since the gain ($G_{30}+G_{36}$) is added to the gain $G_{10}$, in cases (1) and (2), the characteristic of the gain ($G_{30}+G_{36}$) uniformly increases by the gain $G_{13}$. In case (3), the characteristic of the gain ($G_{30}+G_{36}$) uniformly increases by the gain $G_{14}$.

When the AGC voltage $V_{AGC}$ changes from case (2) to case (3), the gain ($G_{30}+G_{36}$) increases by the gain $2\cdot\Delta G_3$. The gain $G_{10}$ decreases by the gain $\Delta G_1$ and $\Delta G_1=2\cdot\Delta G_3$. Consequently, when the AGC voltage $V_{AGC}$ changes from case (2) to case (3), the characteristic of the gain ($G_{30}+G_{36}+G_{10}$) has no step.

In cases (1), (2), and (3), the portions of the characteristic of the gain ($G_{30}+G_{36}$) are parallel to each other. Accordingly, as shown by one line in graph C in FIG. 5, the characteristic of the gain ($G_{30}+G_{36}+G_{10}$) in cases (1) to (3) continuously decreases at a fixed rate.

In equation (A), the total gain $G_{ALL}$ is obtained by combining the gain ($G_{30}+G_{36}+G_{10}$) having the characteristic shown in graph C in FIG. 5, the gain $G_{17}$ which is constant irrespective of the AGC voltage $V_{AGC}$, and the losses. Accordingly, the characteristic of the total gain $G_{ALL}$ continuously changes linearly with respect to the AGC voltage $V_{AGC}$ in a manner similar to the case of the characteristic of the gain ($G_{30}+G_{36}+G_{10}$) shown in graph C in FIG. 5.

As mentioned above, when the foregoing antenna unit 10 and the receiver 30 are used, the total gain $G_{ALL}$ between the output terminal of the antenna 11 and the input terminal of the amplifier 37 continuously changes uniformly over a wide range of the AGC voltage $V_{AGC}$. Consequently, AGC can be effectively performed over a wide range of received signal strength.

In this case, as has been obviously understood from the description regarding FIGS. 3 to 5, in the case where the received signal strength is low and the AGC voltage $V_{AGC}$ is low, that is, in case (1), the high-frequency amplifiers 13 and 33 are used. Consequently, the received signal can be amplified to a sufficient level in a suitable NF state.

In the case where the received signal strength is high and the AGC voltage $V_{AGC}$ is high, that is, in case (3), the high-frequency amplifiers 13 and 33 are not used and the attenuator circuits 14, 34, and 36 are used. Consequently, the received signal has no distortion due to the saturation of the high-frequency amplifiers and the received signal can be controlled at a suitable level.

Furthermore, in the antenna unit 10, since the gain of the antenna unit 10 can be changed by switching between the high-frequency amplifier 13 and the attenuator circuit 14, it is not necessary for the high-frequency amplifier 10 to comprise a variable gain amplifier. Accordingly, the NF does not deteriorate.

When the antenna unit 10 is disposed on the roof of a car and the receiver 30 is arranged in the car, the operating voltage $V_{PWR}$ can be supplied from the receiver 30 to the antenna unit 10 through the coaxial cable 18.

In this case, the operating voltage $V_{PWR}$ changes according to the AGC voltage $V_{AGC}$. The amplifier 13 and the attenuator circuit 14 are alternately selected in the antenna unit 10 according to a change of the operating voltage $V_{PWR}$. Consequently, when the gain of the antenna unit 10 is changed, a regular coaxial cable can be used as the cable 18. A special cable is not needed and an additional cable is not needed.

Figure 7:
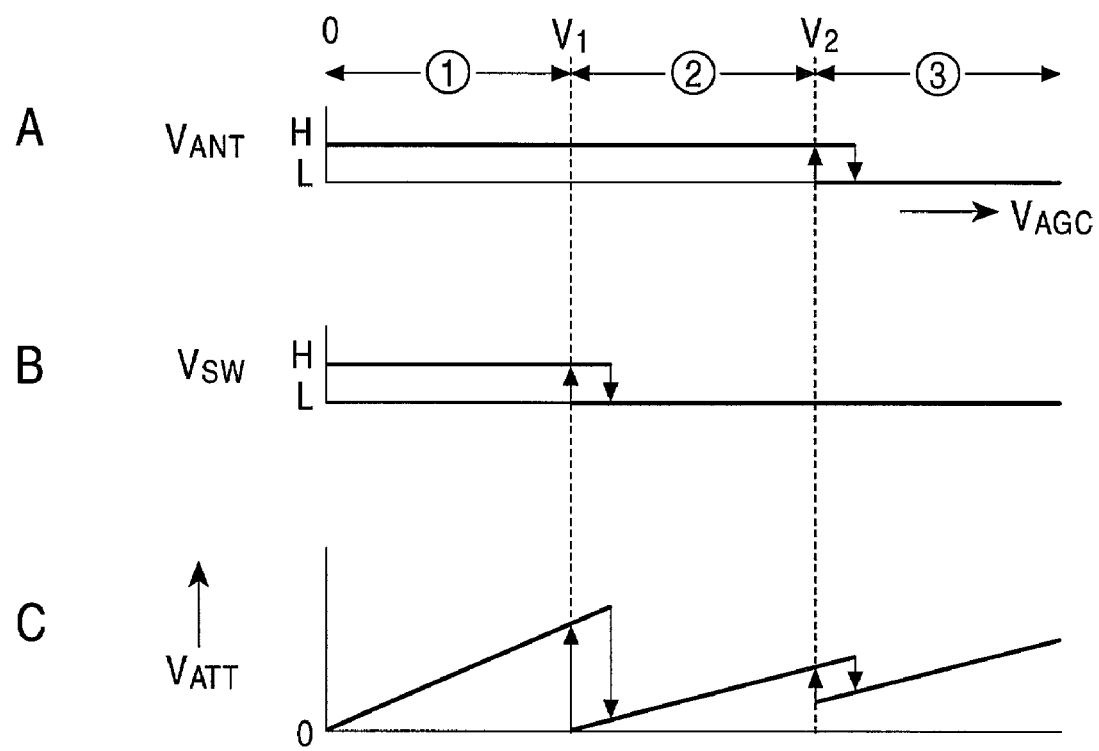
FIG. 7 shows characteristic graphs A to C for explaining another embodiment of the invention.

For example, as shown in FIG. 7, in a case where $V_{AGC}=V_1$ and $V_2$, when the control voltages $V_{ANT}$, $V_{SW}$, and $V_{ATT}$ have hysteresis characteristics, switching between the switching circuits 12 and 15, switching between the switching circuits 32 and 35, and changes in the gains $G_{34}$ and $G_{36}$ of the attenuator circuits 34 and 36 in the case where $V_{AGC}=V_1$ and $V_2$ do not become unstable.

Each of the switching circuits 12, 15, 32, and 35 can comprise a PIN diode or transistor. Furthermore, the above description has been made with respect to the case where the present invention was applied to the receiver 30 and the antenna unit 10 for DARS. Similarly, the present invention can be applied when the receiver is separated from the antenna unit and AGC is needed over a wide range of the received signal strength.

According to the invention, AGC can be effectively performed over a wide range of the received signal strength. In this case, when the level of the received signal is low, the received level can be amplified to a sufficient level in a suitable NF state. When the level of the received signal is high, there is no distortion caused by saturation of the high-frequency amplifier and the received signal can be controlled at a suitable level.

Moreover, in the antenna unit, the NF of the received signal is not deteriorated. When the antenna unit is disposed on the roof of a car and the receiver is arranged in the car, the operating voltage can be supplied from the receiver to the antenna unit through the coaxial cable. Furthermore, the gain of the antenna unit can be also changed via the coaxial cable. Since a regular coaxial cable can be used, neither a special cable nor an additional cable is needed.

What is claimed is:

1. An antenna unit for use with a receiver, the antenna unit comprising:
    an antenna;
    a high-frequency, fixed-gain amplifier for amplifying a reception signal received by the antenna;
    an output cable;
    a fixed-gain attenuator circuit; and
    a switching circuit, wherein
    an output signal of the high-frequency amplifier is supplied to the receiver through the output cable,
    an operating voltage is supplied from the receiver to the high-frequency amplifier through the output cable,
    a control signal is supplied from the receiver to the switching circuit through the output cable, and
    the switching circuit is controlled in accordance with the control signal to selectively connect one of the high-frequency amplifier and the attenuator circuit to a signal line between the antenna and the output cable.

2. The antenna unit according to claim 1, wherein the output cable comprises a coaxial cable.

3. The antenna unit according to claim 1, further comprising a voltage detector circuit, wherein
the control signal is represented by a voltage change in the operating voltage,
the voltage change in the operating voltage is detected by the voltage detector circuit, and
a detection output of the voltage detector circuit controls the switching circuit.

4. The antenna unit according to claim 3, wherein
the control signal is generated from an automatic gain control voltage in the receiver,
when the level of the automatic gain control voltage is equal to or higher than a predetermined level, the attenuator circuit is connected to a signal line, and
when the level of the automatic gain control voltage is lower than the predetermined level, the high-frequency amplifier is connected to a signal line.

5. The antenna unit according to claim 4, wherein the predetermined level to control connecting by the switching circuit has hysteresis characteristics.

6. The antenna unit according to claim 1, wherein the high-frequency amplifier is connected to a band-pass filter.

7. The antenna unit according to claim 1, wherein the output cable comprises a coaxial cable.

8. A receiver using an antenna unit that transmits a signal received by an antenna with a predetermined gain to an output cable and which is capable of changing the gain in accordance with a first control signal, the receiver comprising:
a connector connected to the output cable;
a receiving circuit including at least a high-frequency amplifier, a variable attenuator circuit, and a switching circuit; and
a generator circuit for generating the first control signal and for generating second and third control signals from an automatic gain control voltage corresponding to an output level of the receiving circuit, wherein
an operating voltage, is supplied to the antenna unit through the output cable,
the first control signal generated by the generator circuit is supplied to the antenna unit through the output cable to change the gain,
the switching circuit is controlled in accordance with the second control signal to selectively connect one of the high-frequency fixed-gain amplifier and the variable attenuator circuit to a signal line between the connector and a circuit in a subsequent stage, and
the third control signal controls a gain of the variable attenuator circuit.

9. The receiver according to claim 8, further comprising a circuit for changing the operating voltage supplied to the antenna unit according to the first control signal, the antenna unit being set so that the gain changes according to a change in the operating voltage.

10. The receiver according to claim 8, wherein the output cable comprises a coaxial cable.

11. The receiver according to claim 8, wherein
when a level of the automatic gain control voltage is equal to or higher than a predetermined level, the attenuator circuit is connected to the signal line, and
when the level of the automatic gain control voltage is lower than the predetermined level, the high-frequency amplifier is connected to the signal line.

12. The receiver according to claim 11, wherein the predetermined level to control connection by the switching circuit has hysteresis characteristics.

13. The receiver unit according to claim 8, wherein the output cable comprises a coaxial cable.

* * * * *